United States Patent [19]

Horvath

[11] Patent Number: 4,620,216
[45] Date of Patent: Oct. 28, 1986

[54] UNITARY SLOTTED HEAT SINK FOR SEMICONDUCTOR PACKAGES

[75] Inventor: Joseph L. Horvath, Poughkeepsie, N.Y.

[73] Assignee: International Business Machines Corporation, Armonk, N.Y.

[21] Appl. No.: 812,498

[22] Filed: Dec. 23, 1985

Related U.S. Application Data

[63] Continuation of Ser. No. 489,875, Apr. 29, 1983, abandoned.

[51] Int. Cl.⁴ .................... H01L 23/34; H01L 23/46; H01L 23/12
[52] U.S. Cl. ...................................... 357/81; 357/82; 357/68; 357/65
[58] Field of Search ............................ 357/81, 82, 68; 174/16 HS

[56] References Cited

U.S. PATENT DOCUMENTS 4,296,456 10/1981 Leycraft et al. ................... 361/383

FOREIGN PATENT DOCUMENTS 56-148855 11/1981 Japan ..................................... 357/82

OTHER PUBLICATIONS

"Heatsink Design for Cooling Modules in Forced Air Environment"—Arnold et al—IBM Technical Disclosure Bulletin—vol. 22, No. 6, Nov. 1979, pp. 2297–2298.
"Cooling Fin Structure"—Horvath—IBM Technical Disclosure Bulletin—vol. 23, No. 2, Jul. 1980, pp. 603–604.

Primary Examiner—Andrew J. James
Assistant Examiner—S. V. Clark
Attorney, Agent, or Firm—Wolmar J. Stoffel

[57] ABSTRACT

A unitary heat sink for a semiconductor package having a plurality of cooling fin elements, each element having upwardly extending openings that divide the base into a plurality of leg portions, the heat sink having a plurality of flat base portions individually bonded to a surface of the package, each of the leg portions of an individual fin element being integral with different but adjacent flat base portions, in operation the heat sink preventing a build-up of stresses at the bonded interface of the base portions and package due to differential coefficient of expansions of the heat sink and package.

8 Claims, 4 Drawing Figures

UNITARY SLOTTED HEAT SINK FOR SEMICONDUCTOR PACKAGES

This application is a continuation of Ser. No. 489,875, filed Apr. 29, 1983, now abandoned.

TECHNICAL FIELD

This invention relates generally to heat transfer mechanisms and more particularly to an improved heat transfer mechanism for removing the heat generated in an electronic circuit module assembly.

The high circuit densities in modern integrated circuit semiconductor devices require that the heat generated by their operation be efficiently removed in order to maintain the temperature of the devices within limits that will keep the operating parameters of the devices within predetermined ranges, and also prevent destruction of the device by overheating. The problems associated with heat removal are increased when the device is connected to the supporting substrate with solder terminals that electrically connect the device to appropriate terminals on the substrate as compared to a back bonded device where the support substrate acts as a heatsink. On such solder bonded devices, the heat transfer that can be accomplished through the solder bonds is limited, as compared to back bonded devices. Ordinarily the semiconductor devices are contained in an enclosure and the devices are mounted in or in contact with a heat sink. The heat sink can be cooled with liquid or air. However, when cooling requirements can be met, it is normally less expensive to dissipate the heat with a flow of air, which can be chilled, if desired.

As the size of the substrate supporting the operating device increases, the more significant differences in coefficients of expansion of the materials of the elements of the semiconductor package become. During use the temperature of the package is inherently cycled. Thus when the support substrate is made of ceramic, the lid or enclosure over the devices is also preferably made of ceramic with a corresponding coefficient of expansion. However, ceramic does not conduct heat as well as metal. Therefore, cooling fins formed of ceramic are relatively inefficient when compared to metal and may not be suitable to meet the requirements. Individual metal fins can be bonded to the ceramic to overcome the coefficient of expansion difference problems. However, the finned lid is fragile and relatively expensive because the tedious and time-consuming operation of individually bonding the fins. A large unitary fin assembly can be bonded to the lid surface. However, since the coefficient of expansion of metal and ceramic are quite dissimilar either the fins and lids will separate, and/or the assembly would bow when heated. At the very least, stresses are generated which can be detrimental to the reliability over the life of the package.

PRIOR ART

U.S. Pat. No. 4,277,816 discloses a cooling system for a semiconductor package where a plurality of individual slotted hollow metal tubes are mounted by brazing or soldering, on the lid that encloses semiconductor devices. A blower and a baffled chamber are provided to provide impingement cooling of the packages i.e., air is directed axially into the tube mounted on the lid.

SUMMARY OF THE PRESENT INVENTION

It is a principal object of the present invention to provide a heat transfer mechanism for a large scale integrated circuit module that will provide efficient heat removal and which is compatible with ceramic materials.

A more specific object of the invention is to provide an effective and efficient metal heat sink for mounting on ceramic lids that can be thermally cycled without imposing destructive or harmful stresses on the lid.

The foregoing and other objects and advantages are accomplished with a heat sink assembly for mounting on a ceramic lid of a semiconductor package which heat sink is comprised of a plurality of elongated cooling fin elements bonded to a lid wherein the heat sink assembly is provided with plurality slots in the lower side that separate the lower end of each fin element into a plurality of leg portions, said slots terminating short of the upper end, and a plurality of flat quadralateral base portions bonded to the surface of the lid where each quadralateral base portion is joined to the leg portions of one of each of the adjacent cooling fin elements, the flat quadralateral base portions joining said plurality of said hollow cooling fin elements and forming a unitary assembly which will relieve stresses generated by differences in coefficients of expansion of the material of the heat sink assembly and the lid during thermal cycling.

BRIEF DESCRIPTION OF THE DRAWINGS

The details of my invention will be described in connection with the accompanying drawings in which.

BEST MODE FOR CARRYING OUT THE INVENTION

Figure 1:
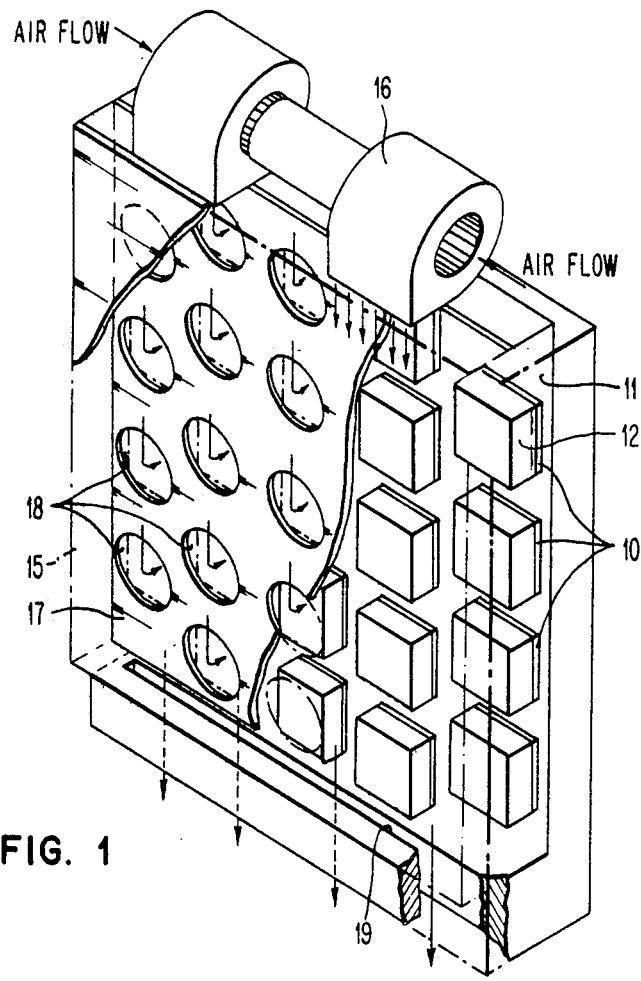
FIG. 1 is a perspective view, partially in section, of an integrated circuit module system in which the fin heat sink structure of my invention is employed.

Referring to FIG. 1, an air cooling system for high density integrated circuit modules for utilizing the heatsink of my invention is schematically illustrated. Large scale integrated circuit chips (not shown) are packaged in modules 10. The modules are in turn supported by printed circuit board 11. The modules 10 each have a heat conductive covering surface and attached to this covering surface is a unitary slotted heatsink element 12. An air plenum 15 is spaced a suitable distance from the top surface of the integrated circuit module. Associated with the air plenum chamber 15 is an air moving device 16. Internal to the air plenum 15 in the surface 17 facing the integrated circuit board assembly of modules are a plurality of openings 18. Under each opening 18 is preferably a module 10 having the unitary heatsink of my invention 12 mounted thereon. In the base of the assembly beneath the air plenum 15 and the circuit board 11 is a slit 19 which permits the exhausted air to be exited from the air cooling system.

Figure 2:
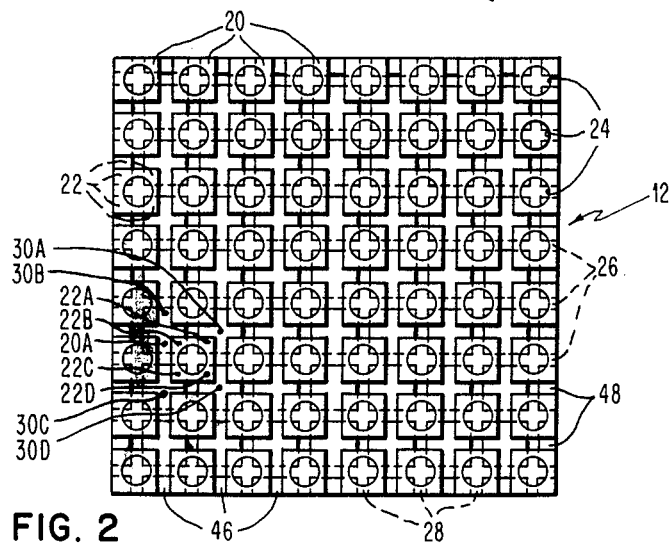
FIG. 2 is a top view illustrating a preferred specific embodiment of the heat sink structure of my invention.
Figure 3:
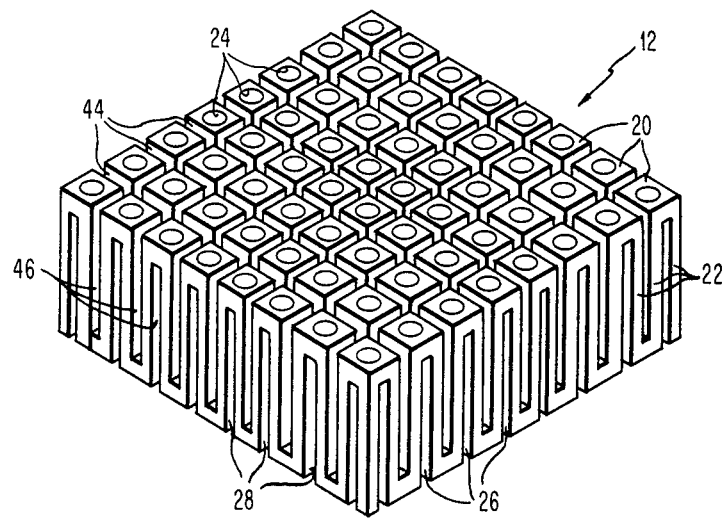
FIG. 3 is a perspective view of the heat sink structure of my invention.
Figure 4:
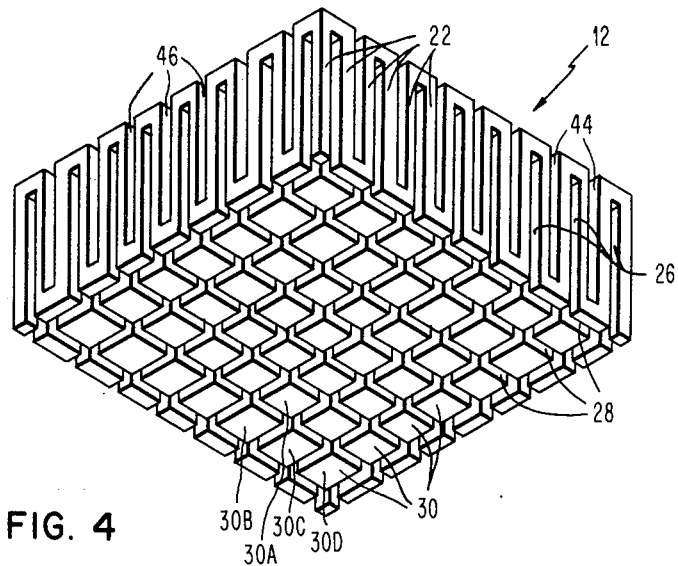
FIG. 4 is another perspective view of the heat sink structure of my invention showing the bottom surface which, in operation, is bonded to the lid of a semiconductor package.

Referring now to FIGS. 2-4 of the drawings, there is illustrated a preferred specific embodiment of the unitary heatsink embodiment 12 of invention. Heatsink 12 is adapted to be bonded directly to the surface of a heat generating body, more preferably the lid of a semiconductor package, wherein heat must be dissipated. The heatsink structure permits bonding directly to materials having a dissimilar coefficient of expansion since the bonding surface is broken up into a plurality of small surfaces that are free to move or flex to the degree necessary for adjusting to the contraction of the surface to which it is bonded.

Heatsink 12 has a plurality of upstanding cooling fin elements 20 that are hollow. The fin elements, as viewed in FIGS. 2 and 3 from the top surface of the assembly 12, are formed by the intersection of parallel slots 44 with parallel slots 46. The slots 44 and 46 extend downwardly from the top surface but stop short of the height of the assembly. The combination of slots 44 and 46 shape the exterior side surfaces of cooling fin elements 20. Each fin element 20 has four upstanding leg portions 22 that are joined at the top of the fin element 20. The leg portions 22 are capable of flexing to accommodate for expansion and contraction of the surface that the heatsink 12 is bonded to, as will be explained and illustrated in more detail. The leg portions 22 are preferably formed by the intersection of parallel slots 26 and parallel slots on the bottom side of assembly 12 that separates the lower end of each fin element into four parts. Parallel slots 26 and 28 also shape the base portions 30, as seen in FIG. 4, that will be bonded to the surface of the package lid. An opening 24 is provided in the top portion of each cooling fin when impingement cooling, in the combination in FIG. 1, is used for dissipating heat. The opening 24 extends downwardly to at least the slots 26 and 28 providing a passage through the fin element 20 with openings in the lower portion to allow cooling medium to flow downwardly and outwardly. This flow of fluid, normally air, provides effective heat dissipation. Turbulence is caused by air flowing outwardly about the four leg portions 22 after entering top opening 24, which dispels the boundary air layer that normally would impede heat transfer.

As shown more clearly in FIG. 4, heatsink 12 has a plurality of square quadralateral shaped flat base portions 30 which, in use, are bonded to the body to be cooled. In the preferred embodiment, the base portions 30 are square, but could be rectangular or round as well. The base portions 30 are attached to the cooling fin elements 20 but in a very special manner. Each of the leg portions 22 of a cooling fin element 20 are each attached to different but adjacent base portions 30. This relationship is most clearly shown in FIG. 2. Stud 20A has four leg portions on the lower end i.e., 22A, 22B, 22C and 22D. Leg 22A is mounted on the base 30A; leg 22B is mounted on base 30B; leg 22C is mounted on base 30C; and leg 22D is mounted on base 30D. Each base portion 30 is thus attached to four different fin elements. The adjacent corners of four base portions 30 thus support a single fin element. Thus, any relative movement of the individual base portions 30, due to heating or cooling effects, is absorbed by flexing of the leg portions 22 of the fin elements. The heatsink structure is unitary because the base portions 30 are all tied together by the upper portions of the cooling fin elements 20. In addition the large area of base portions 30 provide effective thermal transfer of heat to the heat fin elements 20. In addition a hot spot, caused as for example by an active semiconductor device, beneath a base portion 30 results in transfer of heat to four separate fin elements which reduces thermal resistance and also promote a more uniform temperature profile in the heat generating body.

As is obvious from FIG. 4, the base portions that support the fin elements along the edges of the heatsink 12 are approximately one-half the size of the centrally located base portions 30. This is necessary because the outside row of base portions 30 are required to secure the leg portions of only two fin elements.

The heatsink can be made of any suitable material having a thermal conductivity sufficient to meet the demands of the particular application. However, metals are preferred. Preferred metals are copper and aluminum. The heatsink can be bonded to the heat generating body by any suitable technique, as for example, by brazing or soldering. As previously mentioned, the support element, i.e. the lid of a semiconductor package, need not have a coefficient of expansion that matches the material of the heatsink. It is frequently desirable, particularly in larger semiconductor modules, to use a ceramic lid when the substrate is formed of ceramic. Material expansion mismatch between the material of the heat generating body is effectively reduced by reducing the size of the bonding interface, i.e. by breaking the area of the base portion of the heatsink into small individual areas that are free to move relative to one another.

The unitary heatsink of my invention can be fabricated by the method which will now be described. It will be apparent that the relatively complex and intricate heatsink structure can be fabricated by performing a number of simple routine machining operations. In forming the heatsink a solid rectangular or square block of material having the desired size is selected. A first plurality of parallel spaced slots 26, as most clearly shown in FIG. 4, is machined in the bottom of the selected block. The depth of the slots is obviously less than the thickness of the block itself. A second plurality of parallel spaced slots 28 that are transverse to slots 26 is subsequently machined in the bottom of the block. This forms the surface configurations of base portions 30 that serves as the bonding interface. A third plurality of slots 44, positioned between slots 26 which overlap in the block, are machined in the top opposite side of the block. Subsequently, a fourth plurality of parallel slots 46 are machined from the top of the block which are positioned between slots 28 and are also in overlapping relation. These slots 44 and 46 form the exterior shape of the cooling fin elements 20. Holes 42 are drilled from the top of the block to open the fins for impingement cooling.

As most clearly shown in FIG. 4 slots 44 and 46 from the top of the block shape the exterior surface of the fins 20. Slots 26 and 28 from the bottom of the block form the lower four leg portions of the fins 30 and also shape the lower leg portions 22 that support the fin.

The heatsink 12 of the invention can be fabricated in any other suitable manner, as for example by casting. If the heatsink is cast, the slots 26, 28, 44 and 46 can be slightly tapered to facilitate removal of the heat sink 12 from the mold. The depth of the slots and the height of the cooling fin elements can be varied to meet the requirements of the specific application. In general, the width of slots 26 and 28 constitutes approximately $\frac{1}{8}$ to $\frac{1}{2}$ of the total width of the fin elements 20. The relative dimensions of the slots 26 and 28 to the overall height of the cooling fin elements 20 determines the cooling effectiveness and capacity of the structure. Preferably the ratio of the height of the cooling element 20 to the width of slots 26 or 28 is the range of 5 to 50.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

I claim:

1. In a fluid cooled high density integrated circuit semiconductor device module having a substrate with a plurality of semiconductor devices operatively mounted thereon, a lid element mounted on the substrate forming an enclosure for the semiconductor devices, and I/O terminals on said substrate, the improvement comprising a unitary heat sink formed of heat conductive material bonded to said lid element for dissipating heat generated by said semiconductor devices, said heatsink having a plurality of cooling fin elements arranged in columns and rows and positioned orthogonally relative to the top surface of said lid, said fin elements having slots in the lower end that terminate short of the top of the fin element and which divides the lower end of each of the fin elements into a plurality of leg sections, said heat sink having a plurality of flat quadralateral base portions individually bonded to said lid, said leg sections of an individual fin element being attached to different quadralateral base portions with adjacent fin elements supported by adjacent common base portions, in operation said heatsink reducing stresses at the bonded interface of the heatsink and lid by flexure of said leg sections while providing effective large area heat transfer through the lid element to said fin elements.

2. The unitary heatsink of claim 1 wherein each of said cooling fin elements is provided with an opening in the top end which permits downward flow of a cooling medium through said fin elements and exiting outwardly through said slots.

3. The unitary heatsink of claim 2 wherein said heat conductive material is a metal.

4. The unitary heatsink of claim 3 wherein said heat conductive material is aluminum.

5. The unitary heat sink of claim 2 wherein each of said fin elements has a quadralateral cross-sectional configuration.

6. The unitary heatsink of claim 1 wherein the ratios between the height dimension of each of said cooling fin elements to the width of said slots is in the range of 5 to 50.

7. The unitary heat sink of claim 1 wherein each of said fin elements has four leg sections formed by the intersection of two transverse slots.

8. The unitary heat sink of claim 7 wherein the average width of said slots is from $\frac{1}{3}$ to $\frac{1}{2}$ the total horizontal width of the fin elements.

* * * * *